US006400544B1

(12) United States Patent
Grimm et al.

(10) Patent No.: US 6,400,544 B1
(45) Date of Patent: Jun. 4, 2002

(54) CURRENT LIMITING USING CAPACITOR CHARGE MEASUREMENT

(75) Inventors: Michael Arthur Grimm, Boulder Creek; Ramaprabhu Srinivasan, Santa Clara, both of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/360,234

(22) Filed: Jul. 23, 1999

(51) Int. Cl.$^7$ .................................................. H02H 3/00
(52) U.S. Cl. ........................... 361/94; 361/78; 361/93.1
(58) Field of Search ..................... 363/60, 61; 361/94, 361/246, 78, 93.1; 307/130, 131; 327/538, 540, 541, 536; 323/282, 288, 908, 289

(56) References Cited

U.S. PATENT DOCUMENTS

| | | | |
|---|---|---|---|
| 4,812,961 A | * 3/1989 | Essaff et al. | ............. 363/60 |
| 4,897,774 A | 1/1990 | Bingham et al. | |
| 5,229,707 A | 7/1993 | Szepesi et al. | |
| 5,264,780 A | * 11/1993 | Bruer et al. | ............. 323/222 |
| 5,289,137 A | * 2/1994 | Nodar et al. | ............. 330/296 |
| 5,387,882 A | * 2/1995 | Schoofs | ............. 331/111 |
| 5,579,193 A | * 11/1996 | Schmidt et al. | ............. 361/56 |
| 5,680,300 A | * 10/1997 | Szepesi et al. | ............. 363/59 |
| 5,854,564 A | * 12/1998 | Darmawaskita | ............. 327/78 |
| 5,955,915 A | * 9/1999 | Edwards | ............. 327/541 |
| 6,160,441 A | * 12/2000 | Stratakos et al. | ............. 327/540 |

FOREIGN PATENT DOCUMENTS

| | | |
|---|---|---|
| EP | 0402928 | 12/1990 |
| EP | 0402928 A2 | * 12/1990 |

OTHER PUBLICATIONS

MAX828/MAX829 Data Sheet, Rev. 2, Maxim Integrated Products, Inc., Apr. 1997.

* cited by examiner

Primary Examiner—Stephen W. Jackson
(74) Attorney, Agent, or Firm—Blakely, Sokoloff, Taylor & Zafman LLP

(57) ABSTRACT

Current limiting using capacitor charge measurement to limit the supply current or load current of a circuit, or the current flowing through a device or switch, to prevent the time average current in the switch from exceeding a certain safe level. A replica circuit is used to provide a scaled version of the current in the main switch. The current output of the replica circuit is used to charge a capacitor during the first period of the clock signal so that the capacitor voltage, at any time during the on time, is proportional to the time integral of the current output of the replica circuit, and thus, the time integral of the current in the main circuit. The capacitor voltage, in turn, is compared with a known voltage to determine whether the charge that has flowed through the main switch has exceeded a predetermined maximum. The output of the comparator may be used in various ways, including as a control of the clock duty cycle to limit the on time of the main switch. Various embodiments are disclosed.

42 Claims, 3 Drawing Sheets

CURRENT LIMITING USING CAPACITOR CHARGE MEASUREMENT

BACKGROUND OF THE INVENTION

1. Field of the Invention

The present invention relates to the field of current limiting circuits.

2. Prior Art

Current limiting circuits of various types are well known in the prior art. Such circuits are commonly used to limit the maximum current delivered to a circuit or through a circuit component to avoid excessive heating in the circuit or circuit component and/or an excessive load and/or overheating in the power supply itself. Of particular importance to the present invention, however, are circuits using clocked switches, such as various types of voltage converters.

In the case of switching converters using inductors, energy from a power supply is alternately stored in an inductor and then delivered to the output of the converter. In the case of the energy storage cycle, the current in the inductor will increase at a rate equal to the voltage applied across the inductor divided by the inductance of the inductor. The peak current must be limited, however, to avoid saturation of the inductor, as once the inductor saturates, the inductance drops drastically, resulting in high current spikes, excessive heating of the associated components, high loads on the power supply, etc. In the prior art, a sense resistor is commonly used in series with the inductor, with the voltage drop across the sense resistor being used to limit the current through the inductor. As shall subsequently be seen, the present invention offers an alternative to the use of the sense resistor, particularly in integrated switching converters which include the main switching transistor as part of the integrated circuit.

In the case of charge pump converters and inverters, the switch currents have different characteristics. By way of example, in the case of a voltage doubler, a capacitor is first switched across the input to the doubler to charge the capacitor to the input voltage. The capacitor is then switched so that the capacitor lead previously connected to the low side of the input is now connected to the high side of the input, so that the second lead of the capacitor providing the output of the doubler is now at twice the voltage of the doubler input.

A voltage inverter is similar in operation to a voltage doubler, though is different in the capacitor connection during the second phase of operation. A schematic representation of such a voltage inverter may be seen in FIG. 1, which is representative of such devices as the MAX828/MAX829 devices, manufactured by Maxim Integrated Products, Inc., assignee in the present invention. As with a voltage doubler, during the first phase of operation the capacitor C1 is connected between the input voltage $V_{IN}$ and ground by closing switches S1 and S3 to charge capacitor C1 to the input voltage. Then switches S1 and S3 are opened and switches S2 and S4 are closed, connecting the side of the capacitor that was originally connected to the input to the circuit ground, so that the opposite side of the capacitor originally connected to circuit ground will be at the voltage $-V_{IN}$. Capacitor C2 provides smoothing and charge storage for the output voltage, with inverter I1 providing the alternate switch closings in response to a clock signal. In that regard, the alternate switch closed waveforms are non-overlapping to avoid momentary shorting of the input or the output to ground.

In the case of a charge pump voltage inverter illustrated in FIG. 1, switches S3 and/or S4 may be diodes rather than switches. Similarly, in a voltage doubler, two of the four devices may be diodes rather than switches, diodes simplifying the circuits but increasing the power dissipation and decreasing the voltage (positive or negative) obtained. In that regard, all four devices are rectifying devices in the sense that current only flows through each device in one direction, though two of the four devices must also at times be blocking devices, even though the same remain forward biased. Thus two of the four rectifying devices can be diodes, though the other two devices must have a switching capability. Of course, voltage doublers and inverters are merely exemplary of the many various circuits in which charge pumps are used, many charge pump circuits being used to obtain different voltages, both higher and lower, than merely doubling or inverting a supply voltage.

In the case of a charge pump circuit such as a voltage doubler or voltage inverter, the output of the circuit will have a finite impedance dependent upon the effective resistance of the pumping or fly capacitor, the resistance of the switches and the inverse of the product of the clock frequency and capacitance of the fly capacitor. In essence, the capacitor pumps a charge to the output on each clock cycle to provide the load current until the next clock cycle. Consequently, the fly capacitor (capacitor C1 of FIG. 1) must be sufficiently large for a given clock frequency to deliver the required charge to the output on each cycle without an excessive voltage drop on the capacitor during the second phase of operation of the circuit when the capacitor is coupled to the output. By way of example, assume a 5 volt inverter is to provide a −5 volt output with a 100 millivolt droop in the output due to the output load (−4.9 volts out). During start-up, however, when the output capacitor (capacitor C2 of FIG. 1) is discharged, capacitor C1 will be nearly fully discharged on each of the first few cycles of operation, resulting in switch currents which are approaching 50 times the current required for steady state operation. In the case of a fault condition wherein the output of the circuit is shorted, these extraordinary switch currents may persist indefinitely. While on start-up, switch resistances will limit the peak current and the short time required for start-up will limit the total energy dissipated in the switches and power supply, a short circuit condition for any length of time can cause excessive heating in switches, leading to possible failure of the circuit, as well as drawing excessive power from the power supply.

BRIEF SUMMARY OF THE INVENTION

Current limiting using capacitor charge measurement to limit the supply current or load current of a circuit, or the current flowing through a device or switch, to prevent the time average current in the switch from exceeding a certain safe level. A replica circuit is used to provide a scaled version of the current in the main switch. The current output of the replica circuit is used to charge a capacitor during the first period of the clock signal so that the capacitor voltage, at any time during the on time, is proportional to the time integral of the current output of the replica circuit, and thus, the time integral of the current in the main circuit. The capacitor voltage, in turn, is compared with a known voltage to determine whether the charge that has flowed through the main switch has exceeded a predetermined maximum. The output of the comparator may be used in various ways, including as a control of the clock duty cycle to limit the on time of the main switch. Various embodiments are disclosed.

DETAILED DESCRIPTION OF THE PREFERRED EMBODIMENT

The present invention comprises a method and apparatus for current limiting in clocked switches, such as are used in charge pump circuits to avoid excessive power dissipation in the charge pump circuit and excessive load on the power supply. As shall subsequently be seen, current limiting is achieved not by limiting maximum current, but by limiting the time that the high currents can flow. This assures adequate current flow during circuit start-up and after short circuit conditions to assure timely recovery of the circuit output, when the short circuit is removed. At the same time, this limits power dissipation in the relevant switch, as well as any companion switches, or other circuit elements conducting the same or a related current, and of course also limits the power required from the power supply under extraordinary operating conditions.

Figure 1:
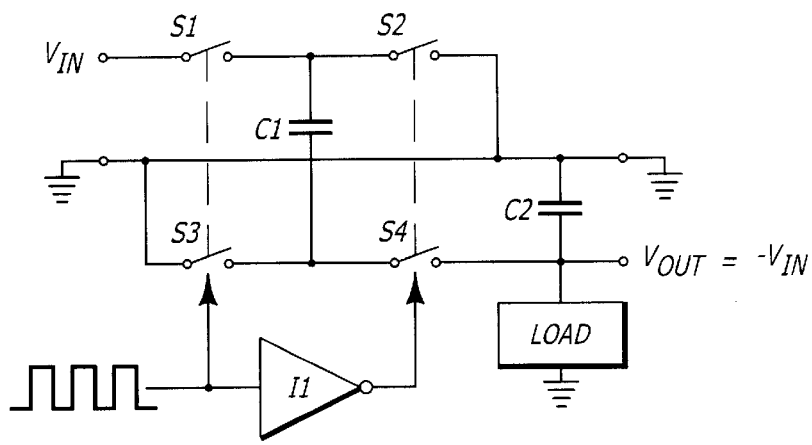
FIG. 1 is a schematic diagram of a switched capacitor voltage inverter.
Figure 2A:
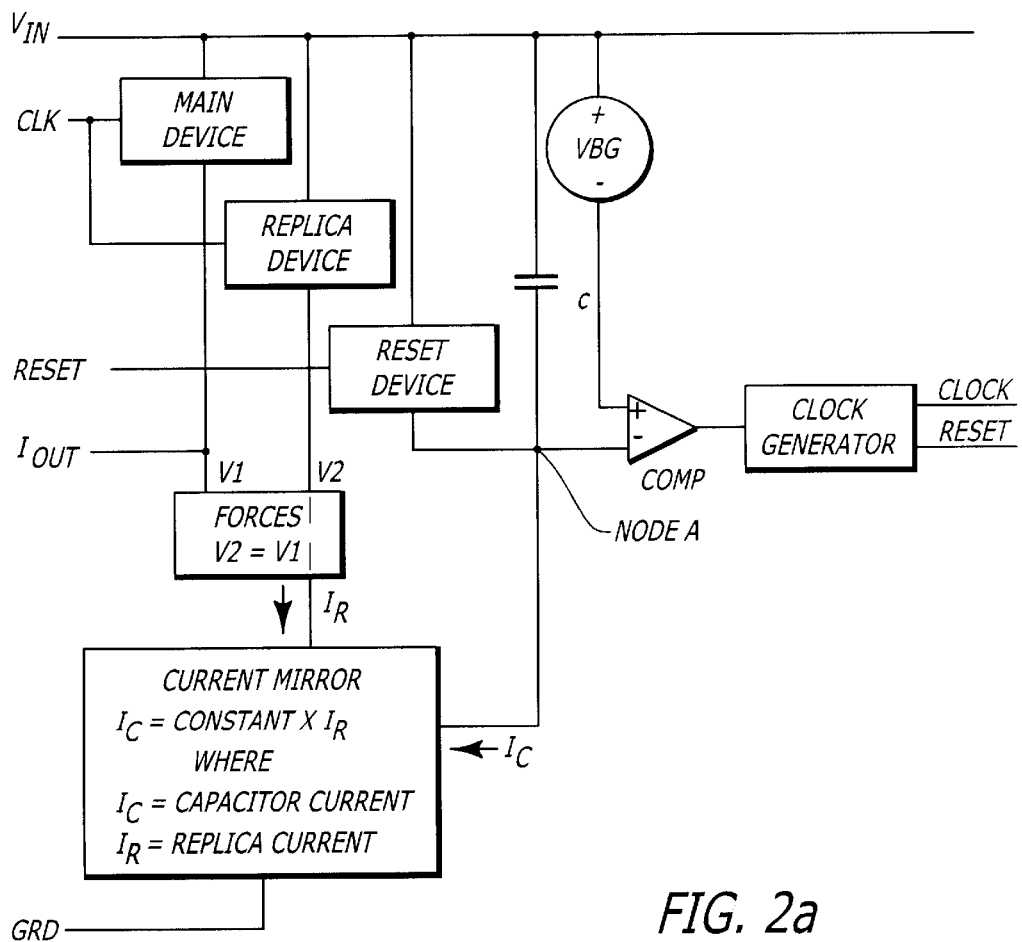
FIG. 2a is a block diagram of an exemplary embodiment of the present invention current limiter.
Figure 2B:
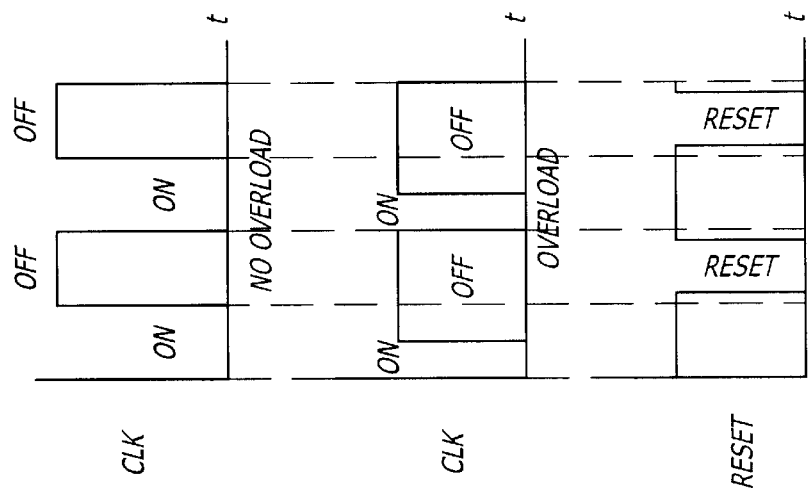
FIG. 2b presents waveforms for the clock signal CLK and reset signal Reset for normal operation and for operation with an overload.
Figure 5:
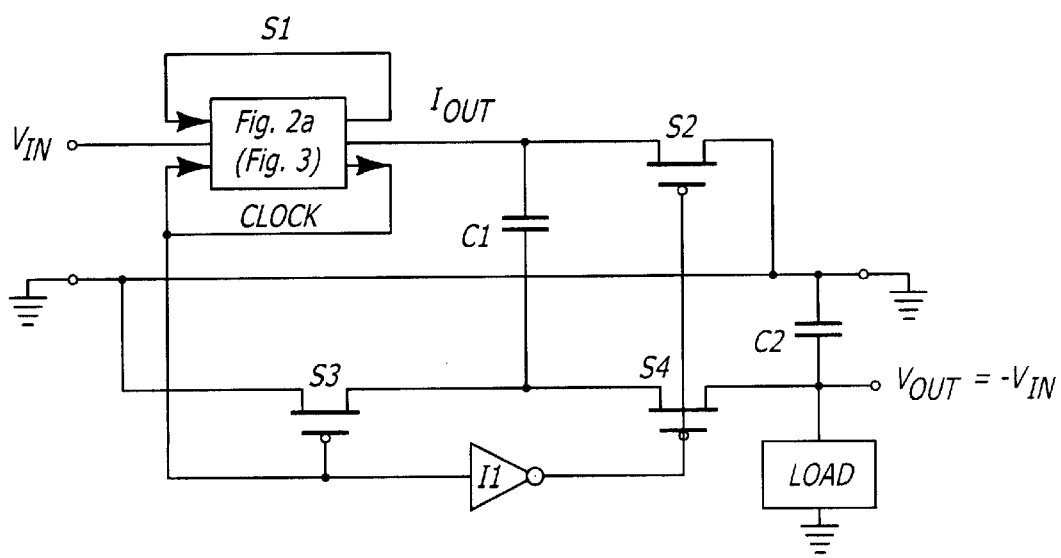
FIG. 5 is a schematic diagram illustrating the use of the embodiment of the present invention current limiter of FIG. 2 in a switched capacitor voltage inverter like that of FIG. 1.

Now referring to FIG. 2a, a block diagram of one embodiment of the present invention may be seen. The specific block diagram shown in FIG. 2a applies to current limiting for a switch coupled to the positive power supply input, such as by way of example, switch S1 in FIG. 1 (see, for example, FIG. 5). However, the principles illustrated by the Figure and the description thereof could readily be applied to other switches, such as by way of example, switch S3 of FIG. 1, by effectively inverting FIG. 2a. As shown in that Figure, the main device S1 is coupled between the input voltage $V_{IN}$ and the switch output $I_{OUT}$, with the control line for the main device being clocked by the clock signal CLK. In the specific embodiment to be subsequently described, the main device is a p-channel transistor, though other types of transistors, such as a pnp transistor, may also be used. Because the main device in the exemplary embodiment is a p-channel device, the main device will be on when the clock signal CLK is low and off when the clock signal CLK is high, as illustrated by the waveforms of FIG. 2b. In addition to the main device of FIG. 2, a replica device is provided, coupled in parallel with the main device. In the specific embodiment to be described with respect to FIG. 3, the main device is a p-channel transistor and accordingly, the replica device would also be a p-channel transistor, with the gates of the main device and replica device connected together. If the main device and replica device were junction transistors instead, such as pnp transistors, the bases of the transistors would be connected together. In either event, the drains or collectors of the main device and replica device are connected to a circuit which forces the drain or collector of the replica device to the same voltage as the drain or collector of the main device. The main device is typically N times the size of the replica device, where N is typically large, such as, by way of example, on the order of 10,000. The current in the replica device is mirrored by a current mirror to a capacitor C, with the voltage across the capacitor being compared to a reference voltage VBG by a comparator Comp. The output of the comparator, in turn, controls a clock generator, which provides a clock signal CLK and a reset signal Reset. The clock signal CLK is used to control the main device and the replica device, with the reset signal controlling a reset device to controllably discharge the capacitor C.

FIG. 2b provides three exemplary waveforms for the embodiment of FIG. 2a, and the embodiment of FIG. 3 to be subsequently explained. The first waveform, for the no overload condition, shows the waveform for the clock signal CLK for normal operation. The second waveform, for the overload condition, shows the waveform for the clock signal CLK for a representative overload condition. The third waveform shows the reset signal waveform for the exemplary embodiment, which waveform is applicable to both the no overload and overload conditions of the circuit.

As shown in the waveforms of FIG. 2b, in a no overload condition, the clock signal CLK has an approximately 50% duty cycle. By way of example, switch S1 of FIG. 1 would be on for approximately 50% of the time while capacitor C1 is charged to the input voltage $V_{IN}$, and off 50% of the time while the capacitor is connected to the output to deliver charge thereto. At the beginning of a full clock cycle, the clock signal CLK will go low. This turns on both the main device and the replica device. The current in the replica device (which is proportional to the current in the main device) is mirrored to charge capacitor C. This causes the voltage (node A) on the negative input to the comparator Comp to decline at a rate proportional to the mirrored current, in effect providing a voltage across the capacitor proportional to the integral of the current in the main device. In the no overload condition, the voltage $V_{IN}-V_C$, where $V_C$ is the voltage across the capacitor, will remain above the reference voltage VBG on the positive input to the comparator throughout the half-period of the clock cycle. In an overload condition, however, such as caused by a short or other excessive current load on the output of the switch, or during the first few cycles of operation as the circuit in which the main switch is used comes up to normal operating conditions, the higher current in the main switch will cause a proportionally higher current being mirrored to the capacitor. This will cause the voltage on the negative input of the comparator to swing below the voltage on the positive input to the comparator before the end of the half-period of the clock cycle, driving the comparator output high. As is shown in the second waveform of FIG. 2b, this causes the clock signal CLK to immediately go high, remaining high until the next full clock cycle begins.

The voltage on node A at time t during each clock cycle, assuming t=0 when the main and replica devices are turned on, may be expressed as:

$$V_{nodeA} = V_{IN} - \frac{1}{NC}\int_0^t I_{S1}(t)dt$$

where:
  N is equal to the current in the main device divided by the current in the replica device, as mirrored to node A
  $I_{s1}(t)$ is the instantaneous current in switch S1
  The average output current $I^{OUT}$ is:

$$I_{OUT}=I_{S1}D$$

Where D is the duty cycle of switch S1, normally 50% and $I_{S1}$ is the current in switch S1 averaged over the on time of the switch In an overload condition, the main and replica devices will turn off when the voltage $V_C$ across the capacitor is:

$$V_C = \frac{1}{NC}\int_0^\tau I_{SI}(t)dt = VBG$$

But $$\int_0^\tau I_{SI}(t)dt$$

is equal to the charge delivered to the switch output during that clock cycle. Consequently, when clocking the switch at a frequency f, the average current $I^{OUT}$ delivered to the switch output is:

$$I_{OUT} = f\int_0^\tau I_{SI}(t)dt = fNC(VBG)$$

Thus the net result is that the average switch current in an overload condition is limited by certain parameters, thereby limiting the power dissipation in the switch and elsewhere in the circuitry and power supply. This is accomplished by limiting the charge transferred through the switch on each clock cycle to a predetermined maximum.

Figure 3:
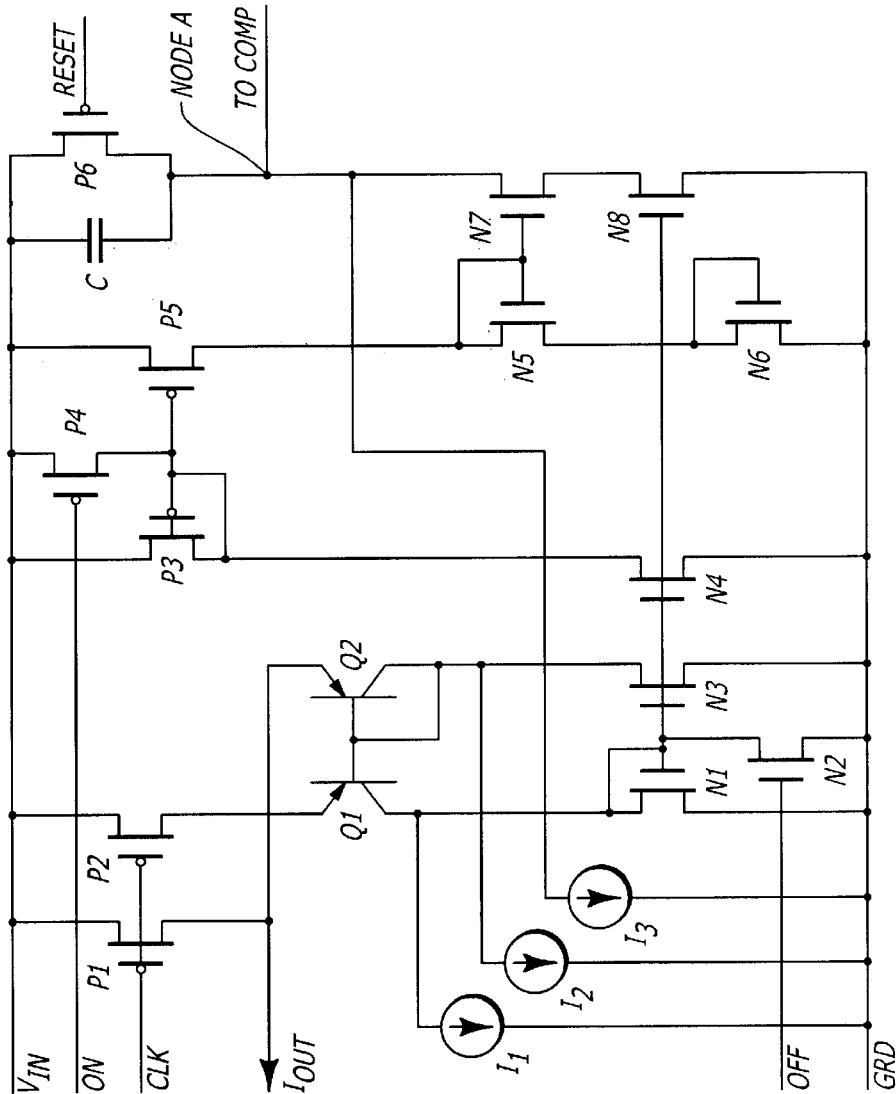
FIG. 3 is an exemplary circuit diagram for an embodiment in accordance with FIGS. 2a and 2b.

Now referring to FIG. 3, a circuit diagram for an exemplary circuit implementing the system of FIGS. 2a and 2b may be seen. In this circuit, p-channel transistors are designated by a transistor number preceded by the letter P, whereas n-channel transistors are designated by a transistor number preceded by the letter N. The circuit also includes two pnp transistors, each identified by an appropriate number preceded by the letter Q. In addition to the circuit connections corresponding to those of FIG. 2a, the circuit of FIG. 3 also is provided with an on signal ON and an off signal OFF, each being the complement of the other.

In normal operation, the on signal ON is high, holding transistor P4 off, and the off signal OFF is low, holding transistor N2 off. When the clock signal CLK is high (see FIG. 2b), transistor P1, which is the main device of FIG. 2a, and transistor P2, which is the replica device of FIG. 2a, are both off. During this time, the reset signal Reset will go low and then return high, momentarily turning on transistor P6 to discharge capacitor C, bringing node A to the input voltage $V_{IN}$. Then, in the second phase of the clock signal, when signal CLK goes low, transistors P1 and P2 are both turned on. The average current through transistor P1, the main device, is the output current $I_{OUT}$. The current through transistor P2 also flows through transistor Q1 and transistor N1, being mirrored by transistor N1 to transistors N3, N4 and N8. The current mirrored to transistor N3 also flows through transistor Q2, setting the base voltage of both transistors Q1 and Q2 at one VBE (base-emitter voltage) below the voltage of the output line providing the current $I^{OUT}$. The drain of transistor P2, like the drain of transistor P1, is at a voltage one VBE above the bases of transistors Q1 and Q2, and thus the voltages on the drains of transistors P1 and P2 are substantially identical. Consequently, with the operating conditions of transistors P1 and P2 being the same (same source voltage, same gate voltage and same drain voltage), the current through transistor P2 will equal the current through transistor P1 divided by N, where N is the width of transistor P1 divided by the width of transistor P2, assuming transistors P1 and P2 have equal lengths. Typically, N will be large, so that the rest of the circuit will require little power in comparison to the output provided by transistor P1.

The current mirrored to transistor N4 is in turn mirrored by transistors P3 and P5 to transistors N5 and N6. Transistors N5 and N6 generate a cascode voltage for transistor N7. The cascode transistor N7 allows transistor N8 to more accurately reflect the current in transistor N1. The cascode is not required, but does improve the accuracy of the current mirroring if used. Thus, the resulting pull-down current at node A is equal to (or proportional to, depending on transistor area ratios) the current through transistor P2, which in turn is 1/N times the current in transistor P1. Thus, the specific circuit shown in FIG. 3 functions as described for the block diagram system shown in FIG. 2a, with the waveforms thereof shown in FIG. 2b.

In the circuit of FIG. 3, if the circuit is turned off, the off signal OFF will go high and the on signal ON will go low. The off signal OFF going high turns on transistor N2, turning off transistors N1, N3, N4 and N8 to shut off the current flow through these transistors. The on signal ON going low similarly turns on transistor P4, turning off transistors P3 and P5 to further shutdown current flow through these transistors.

In addition to the circuit elements of the exemplary embodiment just described, FIG. 3 further includes current sources $I_1$, $I_2$ and $I_3$. Current source $I_2$ provides a pull-down current at the base of transistors Q1 and Q2 to assure startup for the self-biased loop formed by transistors Q1, Q2, N1 and N3. If this current is not provided and the base of Q1 and Q2 is at a high voltage (e.g. $V_{IN}$) initially, the circuit will not startup. Current sources $I_1$ and $I_3$ are used to cancel the error introduced by current source $I_2$ in terms of equalizing the mirrored current values. Current sources $I_1$, $I_2$ and $I_3$ should all be equal or proportional to each other. Current sources $I_1$ and $I_3$ may not be required if current source $I_2$ can be made low enough. It may also be possible to turn off all three current sources once startup has been achieved.

In the circuit of FIG. 3, MOS transistors have been used for all transistors except transistors Q1 and Q2, though p-channel transistors could be used for these transistors also. Further, the system described with respect to FIGS. 2a and 2b and the circuit shown in FIG. 3 are shown for use, by way of example, in place of switch S1 of FIG. 1, namely, a switch referenced to the high side of the input. The same principles may be applied, instead, to current limiting in a switch referenced to the low side of the input, such as, by way of example, switch S3 in FIG. 1. This may be accomplished by essentially turning the circuit of FIG. 3 upside down, changing all p-channel transistors to n-channel transistors, n-channel transistors to p-channel transistors and the two pnp transistors to npn transistors (together with appropriate inversion of waveforms). Also, the circuits could be realized with all junction transistors or any mix of transistors desired, provided that the main device and the replica device (FIG. 2) are of the same type. Any such circuits could also be used in switching power supplies using inductors, if desired.

Further, while FIG. 3 shows transistors P1 and P2 as well as transistors P3 and P5 and capacitor C being connected to the input voltage $V_{IN}$, it should be noted that it is not a requirement for this common connection. In particular, the sources of transistors P3 and P5 and capacitor C might be connected to a positive power supply voltage, with the sources of transistors P1 and P2 being connected to some other, possibly time-varying, voltage, provided that when transistors P1 and P2 are turned on, that time-varying voltage gave sufficient headroom (sufficient voltage above ground for circuit operation) to allow mirroring of the current through transistor P2 to the rest of the circuit. Further, whether the current through transistor P2 is mirrored to provide a pull-down current for the capacitor C, as shown in FIG. 3, or mirrored to provide a pull-up current for a capacitor coupled to the ground line GRD, is a matter of choice. In that regard, mirroring to the capacitor could be eliminated, by way of example, by replacing transistor N3 of FIG. 3 with a resistor, and using the collector current in transistor Q1 as a pull-up current to charge capacitor C (and changing the inputs to the comparator Comp accordingly). While this will put different currents through transistors Q1 and Q2, resulting in the VBEs of the transistors being slightly different, the difference will only be a few millivolts and would have little effect on the ratio of currents between the main device and the replica device.

In the preferred embodiment, the current through the transistor switch is replicated in a replica switch, both when the transistor switch is on and when it is off. However, when the transistor switch is off, the replica device does not necessarily need to be off, provided the capacitor is in the reset condition when the transistor switch is turned back on.

Figure 4:
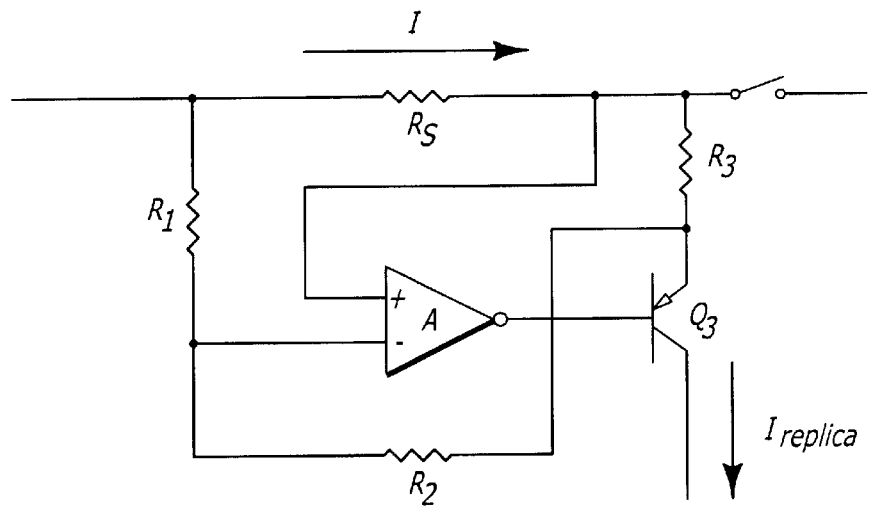
FIG. 4 is an exemplary diagram illustrating the use of a sense resistor in the generation of a replica current.

Also in the preferred embodiment, the current through a transistor switch is replicated in a replica switch. However, other techniques for replicating the switch current may be used if desired. By way of example, FIG. 4 illustrates a switch current replication circuit using a current sense resistor $R_S$. In this circuit amplifier A controls the base of transistor Q3 to hold the differential input to the amplifier at zero. While not necessary to the operation of the circuit, it is convenient to make resistors $R_1$, $R_2$ and $R_3$ all equal ($R_1=R_2=R_3=R$), and all much larger in resistance than the sense resistor, normally a very low value ($R>>R_S$). With these assumptions, the voltage drop across the resistor $R_1$ must equal the voltage drop across the sense resistor, namely $IR_S$, where I is the switch current (all other currents in the circuit being very low in comparison). Since the current into the inverting input to the amplifier is zero, the voltage drop across resistor $R_2$ must also be $IR_S$, and the current through resistor $R_2$ is $IR_S/R_2$. Consequently the voltage drop across resistor $R_3$ is also $IR_S$, and the current through resistor $R_3=IR_S/R_3$. The current in the emitter of transistor Q3 and the current $I_{replica}$ in the collector of transistor Q3 (the base current of transistor Q3 is assumed to be very low and is neglected) is the sum of the currents in resistors $R_2$ and $R_3$, namely:

$$I_{replica}=2IR_S/R$$

where:
I=the switch current
$R_S$=the resistance of the sense resistor
$R=R_1=R_2=R_3$, and
$R>>R_S$ The foregoing circuit is exemplary only. The specific circuit shown could be readily adapted to any switch, referenced to the positive or negative circuit voltages. Similarly the sense resistor could be on either side of the switch, and the transistor could be a MOS device. The circuit illustrates that the replica current may be derived by use of a replica switch, or by replicating the switch current by other means, such as through the use of another device in series with the switch.

Relating the circuit of FIG. 4 to the circuit of FIG. 3, the switch schematically illustrated in FIG. 4 would be transistor P1 of FIG. 3. Replica transistor P2 and transistors Q1, Q2 and N3 would be eliminated, and the replica current $I_{replica}$ of FIG. 4 would be mirrored to transistors N4 and N8 by transistor N1, the rest of the circuit of FIG. 3 operating as previously described.

The foregoing are only exemplary of the many various ways of practicing the invention. Thus, while the present invention has been disclosed and described with respect to various embodiments thereof, it will be understood by those skilled in the art that various changes in form and detail might be made therein without departing from the spirit and scope of the invention.

What is claimed is:

1. A clocked switch with current limiting comprising:

first and second transistors of the same conductivity type, each having first and second terminals and a control terminal, the conduction through each transistor being responsive to the voltage between the control terminal and the first terminal of the respective transistor, the first terminals of the first and second transistors being coupled together, the control terminals of the first and second transistors being coupled together;

a capacitor;

a first circuit coupled to the second transistor and the capacitor, the first circuit changing the charge on the capacitor at a rate responsive to the current through the second transistor;

a second circuit coupled to the capacitor to controllably set the voltage on the capacitor to a predetermined value responsive to a reset signal;

a clock generator coupled to the control terminal of the first transistor and to the second circuit, the clock generator providing a clock signal to the control terminal of the first transistor to successively turn the transistor on and off in normal operation, and providing a reset signal to the second circuit to set the voltage on the capacitor to the predetermined value when the first transistor is turned off; and, a third circuit coupled to the capacitor and a reference voltage to cause the first transistor to turn off earlier than in normal operation responsive to a comparison of the voltage on the capacitor to the reference voltage indicative of an overload condition in the time integral of the current through the first transistor.

2. The clocked switch of claim 1 wherein the second terminal of the second transistor is coupled to the first circuit through a fourth circuit also coupled to the second terminal of the first transistor, the fourth circuit controlling the voltage of the second terminal of the second transistor so that the operating voltage of the second terminal of the second transistor substantially tracks the operating voltage of the second terminal of the first transistor.

3. The clocked switch of claim 1 wherein the clock generator provides a clock signal to the control terminal of the first transistor to successively turn the transistor on and off in normal operation with a predetermined duty cycle.

4. The clocked switch of claim 1 wherein the third circuit comprises a comparator.

5. The clocked switch of claim 1 wherein the first transistor is larger in size than the second transistor.

6. The clocked switch of claim 1 wherein the second circuit comprises a third transistor.

7. The clocked switch of claim 6 wherein the first, second and third transistors are MOS transistors.

8. The clocked switch of claim 1 wherein the first circuit comprises at least one current mirror.

9. The clocked switch of claim 1 further comprised of third and fourth transistors, each having first and second terminals and a control terminal, the conduction through each of the third and fourth transistors being responsive to the voltage between the control terminal and the first terminal of the respective transistor, the first terminal of the third transistor being coupled to the second terminal of the second transistor, the first terminal of the fourth transistor being coupled to the second terminal of the first transistor, the control terminal of the fourth transistor being coupled to the second terminal of the fourth transistor and to the control terminal of the third transistor, the second terminal of the fourth transistor being coupled to a current source, the second terminal of the third transistor being coupled to the first circuit.

10. The clocked switch of claim 9 wherein the first and second transistors are MOS transistors and the third and fourth transistors are junction transistors.

11. The clocked switch of claim 9 wherein the first circuit comprises a current mirror mirroring the current from the second terminal of the third transistor to the capacitor.

12. The clocked switch of claim 11 wherein the current mirror also mirrors current from the second terminal of the third transistor to the second terminal of the fourth transistor to provide the current source coupled thereto.

13. A charge pump circuit comprising:
   a first capacitor;
   first, second, third and fourth rectifying devices, two of the rectifying devices being first and second transistors;
   a third transistor, each of the first, second and third transistors having first and second terminals and a control terminal, the conduction through each transistor being responsive to the voltage between the control terminal and the first terminal of the respective transistor;
   two of the first, second, third and fourth rectifying devices being connected to couple the first capacitor across a charge pump input during a first phase of a clock cycle, the other two of the first, second, third and fourth rectifying devices being connected to couple the first capacitor across a charge pump output during a second phase of a clock cycle;
   the first terminals of the first and third transistors being coupled together and the control terminals of the first and third transistors being coupled together;
   a second capacitor;
   a first circuit coupled to the third transistor and the second capacitor, the first circuit changing the charge on the second capacitor at a rate responsive to the current through the third transistor;
   a second circuit coupled to the second capacitor to controllably set the voltage on the second capacitor to a predetermined value responsive to a reset signal;
   a clock generator coupled to the control terminal of the first transistor and to the second circuit, the clock generator providing a clock signal to the control terminal of the first transistor to successively turn the transistor on and off in normal operation, and providing a reset signal to the second circuit to set the voltage on the second capacitor to the predetermined value when the first transistor is not conducting; and,
   a third circuit coupled to the second capacitor and a reference voltage to cause the first transistor to turn off earlier than in normal operation responsive to a comparison of the voltage on the second capacitor to the reference voltage indicative of an overload condition in the current through the first transistor.

14. The charge pump circuit of claim 13 wherein the second terminal of the third transistor is coupled to the first circuit through a fourth circuit also coupled to the second terminal of the first transistor, the fourth circuit controlling the voltage of the second terminal of the third transistor so that the operating voltage of the second terminal of the third transistor substantially tracks the operating voltage of the second terminal of the first transistor.

15. The charge pump circuit of claim 13 wherein the clock generator provides a clock signal to the control terminal of the first transistor to successively turn the transistor on and off in normal operation with a predetermined duty cycle.

16. The charge pump circuit of claim 13 wherein the third circuit comprises a comparator.

17. The charge pump circuit of claim 13 wherein the first transistor is larger in size than the third transistor.

18. The charge pump circuit of claim 13 wherein the second circuit comprises a fourth transistor.

19. The charge pump circuit of claim 18 wherein the first through fourth transistors are MOS transistors.

20. The charge pump circuit of claim 13 further comprised of fourth and fifth transistors, each having first and second terminals and a control terminal, the conduction through each of the fourth and fifth transistors being responsive to the voltage between the control terminal and the first terminal of the respective transistor, the first terminal of the fourth transistor being coupled to the second terminal of the third transistor, the first terminal of the fifth transistor being coupled to the second terminal of the first transistor, the control terminal of the fifth transistor being coupled to the second terminal of the fifth transistor and to the control terminal of the fourth transistor, the second terminal of the fifth transistor being coupled to a current source, the second terminal of the fourth transistor being coupled to the first circuit.

21. The charge pump circuit of claim 20 wherein the first through third transistors are MOS transistors and the fourth and fifth transistors are junction transistors.

22. The charge pump circuit of claim 20 wherein the first circuit comprises a current mirror mirroring the current from the second terminal of the fourth transistor to the capacitor.

23. The charge pump circuit of claim 22 wherein the current mirror also mirrors current from the second terminal of the fourth transistor to the second terminal of the fifth transistor to provide the current source coupled thereto.

24. The charge pump circuit of claim 13 wherein a transistor connected to couple the first capacitor across a charge pump input during a first phase of a clock cycle is the first transistor.

25. A method of limiting the current through a clocked transistor switch comprising:
   coupling a replica circuit to the transistor switch so that when the transistor switch is on, the current in the replica circuit is proportional to the current in the transistor switch;
   clocking the transistor switch on and off in first and second phases of a clock cycle;
   when the transistor switch is on, changing the charge on a capacitor at a rate proportional to the current through the replica circuit;
   turning off the transistor switch before it is clocked off if the change in voltage on the capacitor exceeds a first predetermined voltage change; and,
   when the transistor switch is off, changing the voltage on the capacitor to a second predetermined voltage.

26. The method of claim 25 wherein the second predetermined voltage is zero.

27. The method of claim 25 wherein the replica circuit comprises a replica transistor coupled in parallel with the transistor switch when the transistor switch is on.

28. The method of claim 27 wherein the replica circuit comprises a sense resistor in series with the transistor switch and circuitry for providing a current proportional to the current through the sense resistor.

29. The method of claim 25 wherein when the transistor switch is on, the charge on the capacitor is changed at a rate proportional to the current through the replica circuit by mirroring the current in the replica circuit to the capacitor.

30. A method of operating a charge pump circuit to limit the current comprising:

providing a first capacitor, four rectifying devices, at least two of which are transistor switches, and a clock signal;

coupling the first capacitor across a charge pump input during a first phase of each clock cycle by turning on at least a first of the transistor switches, and coupling the first capacitor across a charge pump output during a second phase of each clock cycle by turning off the first transistor switch and turning on at least the second transistor switch;

coupling a replica transistor to the first or second transistor switch so that when the transistor switch is on, the current in the replica transistor is proportional to the current in the transistor switch, the replica transistor being of the same conductivity type as the transistor switch to which it is coupled;

when the transistor switch is on, changing the charge on a second capacitor at a rate proportional to the current through the replica transistor;

turning off the transistor switch before it is clocked off if the change in voltage on the second capacitor exceeds a first predetermined voltage change during the first phase of the clock cycle; and, when the transistor switch is off, changing the voltage on the second capacitor to a second predetermined voltage.

31. The method of claim 30 wherein the second predetermined voltage is zero.

32. The method of claim 30 wherein the replica transistor is clocked on and off in unison with the transistor switch.

33. The method of claim 30 wherein when the transistor switch is on, the charge on the second capacitor is changed at a rate proportional to the current through the replica transistor by mirroring the current in the replica transistor to the second capacitor.

34. The method of claim 30 wherein the transistor switch to which the replica transistor is coupled is the first transistor switch.

35. A clocked switch with current limiting comprising:

a transistor switch;

a first circuit coupled to provide a current proportional to the current through the transistor switch when the transistor switch is turned on;

a capacitor;

the first circuit being coupled to the capacitor, the first circuit changing the charge on the capacitor at a rate responsive to the current through the transistor switch;

a second circuit coupled to the capacitor to controllably set the voltage on the capacitor to a predetermined value;

a clock generator coupled to the capacitor and to the control terminal of the transistor switch, the clock generator providing a clock signal to the control terminal of the transistor switch to successively turn the transistor on and off in normal operation, and providing a reset signal to the second circuit to set the voltage on the capacitor to the predetermined value when the transistor switch is turned off; and, a third circuit coupled to the capacitor and a reference voltage to cause the transistor switch to turn off earlier than in normal operation responsive to a comparison of the voltage on the capacitor to the reference voltage indicative of an overload condition in the time integral of the current through the transistor switch.

36. The clocked switch of claim 35 further comprised of a sense resistor in series with the transistor switch, the first circuit being coupled to the sense resistor.

37. The clocked switch of claim 35 wherein the first circuit comprises a replica transistor in parallel with the transistor switch when the transistor switch is on.

38. The clocked switch of claim 37 wherein the transistor switch is larger in size than the replica transistor.

39. The clocked switch of claim 35 wherein the clock generator provides a clock signal to the control terminal of the first transistor to successively turn the transistor on and off in normal operation with a predetermined duty cycle.

40. The clocked switch of claim 35 wherein the third circuit comprises a comparator.

41. The clocked switch of claim 35 wherein the second circuit comprises a transistor switch.

42. The clocked switch of claim 41 wherein the transistors are MOS transistors.

* * * * *